United States Patent [19]

Lewinter

[11] Patent Number: 4,573,188
[45] Date of Patent: Feb. 25, 1986

[54] DIGITAL TO ANALOG CONVERTER

[75] Inventor: Sidney W. Lewinter, Redondo Beach, Calif.

[73] Assignee: The Aerospace Corporation, Los Angeles, Calif.

[21] Appl. No.: 685,756

[22] Filed: Dec. 24, 1984

Related U.S. Application Data

[63] Continuation of Ser. No. 386,836, Jun. 10, 1982, Pat. No. 4,499,594.

[51] Int. Cl.$^4$ ................................................ G10L 1/00
[52] U.S. Cl. .............................. 381/46; 340/347 DA; 381/47; 375/34
[58] Field of Search ...................... 381/47, 46; 375/26, 375/34, 76; 455/222, 224; 364/574; 340/347 DA

[56]        References Cited
          U.S. PATENT DOCUMENTS

| | | | |
|---|---|---|---|
| 3,478,266 | 11/1969 | Gardenhire et al. | 375/26 |
| 3,712,959 | 1/1973 | Fariello | 179/1 |
| 3,745,463 | 7/1973 | Klein | 325/42 |
| 3,825,925 | 7/1974 | Drusch | 340/347 |
| 4,044,309 | 8/1977 | Smith | 325/478 |
| 4,331,837 | 5/1982 | Soumagne | 179/1 |

Primary Examiner—E. S. Matt Kemeny
Attorney, Agent, or Firm—Harness, Dickey & Pierce

[57]        ABSTRACT

Techniques are disclosed for converting a multibit digital data word into a corresponding analog signal. The converter of the present invention utilizes information in a received signal plus noise associated with the information in such a manner as to reduce the mean squared error in the generated analog signal. The actual voltage associated with each bit position in the digital word is measured. In addition, a measurement of the signal-to-noise ratio is made. From these two measurements a processing device is adapted to generate a value corresponding to the statistical probability that the detected voltage level for each bit is a logical one. The probability values are used as scaling factors to modify the weights to be given each bit during the normal digital to analog conversion process.

1 Claim, 6 Drawing Figures

DIGITAL TO ANALOG CONVERTER

This is a continuation of application Ser. No. 386,836, filed June 10, 1982, now U.S. Pat. No. 4,499,594, issued Feb. 12, 1985.

TECHNICAL FIELD

This invention relates to electrical converters and, more particularly, to digital to analog (D/A) converters.

BACKGROUND ART

Digital to analog converters are used in a wide variety of electronic systems where it is necessary to convert a group of digital data samples or words into a corresponding analog signal. A typical application for a D/A converter is in a pulse code modulated speech system where digital codes are transmitted over some distance to a device for reproducing the digital codes as analog speech sounds. In these and other types of applications it is important that the D/A conversion process is as accurate as possible. Unfortunately, electrical noise in the incoming digital data tends to increase the potential for error. Where the digital data is transmitted at great distances from a remote data source this potential for error is especially great.

State of the art D/A converters examine each symbol or bit in the digital word and make an unambiguous decision as to the state of that bit (i.e. 0 or 1 if a binary symbol; 0, 1 or 2 is ternary, etc.). In other words, even if the received voltage level associated with a bit does not correspond to the defined voltage level for either a logical 1 or logical 0 level, the present day converters must make a hard and fast decision as to whether that bit is really a logical 1 or logical 0. The analog value of the digital word is obtained by applying appropriate weighting factors to each bit position in the word and summing together all of the resulting weighted values. For example, if the digital word has n bits in a typical binary code, the analog value of that word is given by $$A = \sum_{k=1}^{n} X_{k-1} 2^{k-1} \tag{1}$$

where $X_k$ is a binary variable, either 0 or 1.

For example, if the digital word comprises four bits, the least most significant bit ($k=1$) is weighted with a value of 1, the second least most significant bit ($k=2$) is weighted with a value of 2, the third least most significant bit ($k=3$) is weighted with a value of 4, and the most significant bit ($k=4$) is weighted with a value of 8.

To perform the operation given by equation (1) a decision has to be made as to the one or zero state of each $X_k$ variable. In an idealized communication system this task poses no problem. However, in the real world this is another matter. Consider, for example, the case where digitized speech samples are transmitted over a noisy channel. In such instances some of the decisions as to whether each bit is a one (or zero) will be wrong because the instantaneous value of the noise added to the binary information signal may cause a one to be misinterpreted as a zero, or a zero to be misinterpreted as a one. These interpretation errors will therefore result in an error in the analog signal produced by the D/A converter, the magnitude of the error being related to the relative weight of the erroneously interpreted bit in its respective digital word. If the misinterpretation error occurred for the most significant bit having a weighting factor of 8, the resulting analog signal error will be substantial.

Although conventional D/A converters utilize a variety of hardware techniques for accomplishing the operation just described, one commonly employed implementation is illustrated in FIG. 1. Serial digital data is received over input line 10. The incoming data signal is a composite of the idealized information signal (S) generated by the data source and electrical noise (N). FIG. 2 illustrates a four-bit digital word comprised of a binary sequence of ones and zeroes, normalized so that a binary one is represented as a +1 volt level and a binary zero is represented as a −1 volt level. In the presence of additive noise, the composite waveform (S+N) will take on additional values other than +1 or −1 volts as a function of time. If the noise has a zero mean value, one decision rule that may be employed by circuitry 12 of conventional converters is to call a bit logical one if it has a positive polarity and call a bit a logical zero if it has a negative polarity. Such a hard decision criteria is particularly susceptible to errors where the voltage "a" for a given bit period is close to zero volts as shown for the most significant bit position in FIG. 2. Using conventional D/A techniques, one is forced to assign a value of one or zero to that bit even though the probability that it should be assigned to the other state is nearly 0.5. It can be seen that the voltage level, a, for the examined bit position may result from a binary one information signal (+1 volt) combined with a negative noise voltage, $e_{n1}$. Alternatively, it can result from a binary zero (−1 volt) added to a positive noise voltage, $e_{n2}$, as also illustrated in FIG. 2. Consequently, in half the instances where such a situation exists, no error in the analog reconstruction will be experienced whereas in the other half there will be an error of a magnitude of $2^{k-1}$ where $1 \leq k \leq n$.

The decision circuitry 12 continues to make these hard decisions for each bit of the received data word, sequentially loading the results into register 14. At the end of the decision process for each word the bit values contained in register 14 are coupled simultaneously in parallel to appropriately weighted analog multiplication circuits 16 whose outputs are summed together by summing device 18 to generate the analog signal. It can be seen that the multiplication circuits 16 are weighted according to the significance of the bit to which it is associated. For example, the most significant bit in our four-bit data word example will be weighted for the value of $2^3$ or 8. Again, it can be seen that an error in interpreting the state of the most significant bit results in a dramatic error in the generated analog signal. In instances such as those described above, the magnitude of the error will therefore be $$\bar{\sigma} = \frac{0.5(2^{k-1}) + 0.5 \times 0}{1} = 2^{k-2} \tag{2}$$

The mean squared error will be:

$$\bar{\sigma}^2 = \frac{0.5(2^{k-1})^2 + 0.5 \times 0}{1} = 2^{2k-3} \tag{3}$$

Note that the mean squared error is greater than the square of the mean error. In fact, $$\frac{\overline{\sigma^2}}{(\sigma)^2} = 2 = 3 \text{ dB} \qquad (4)$$

Thus, it can be seen that errors of some appreciable magnitude can be experienced in using the so-called "hard decision" process employed by conventional digital to analog converters. The present invention is directed to solving these problems and reducing the potential for error.

SUMMARY OF THE INVENTION

Pursuant to the present invention, a "soft" decision process is used in place of the hard decision process employed by the prior art approach. Probability values are generated for each bit in the digital word to be converted. The probability values are based on a function of the signal to noise ratio in the system and the measured electrical characteristics for each bit position. These probability values are employed as scaling factors to modify the weighted multiplication circuits of conventional D/A converters.

For example, if the probability of a bit being a one is very nearly 0.5 as in the example described above, the technique employed in the present invention will scale the multiplication circuit associated with that bit by the value of 0.5. Consequently, the composite weight during the analog reconstruction process will be $0.5(2^{k-1})$. The consequences of such a decision is that in every such instance (voltage level nearly 0 volts) there will be an error of magnitude $0.5(2^{k-1})$ regardless of whether the bit was actually a one or a zero. As before, the average value of the magnitude of the error will be $\overline{\sigma_1} = 0.5(2^{k-1}) = 2^{k-2}$. (In both the conventional process and the techniques taught by the present invention, the frequency of positive errors equals the frequency of negative errors so that the mean error is zero.) The mean squared error will now be:

$$\overline{\sigma_1^2} = [0.5(2^{k-1})]^2 = 2^{2k-4} \qquad (5)$$

A comparison of equation (5) with (3) shows that the techniques of the present invention has 3 dB less mean squared error than conventional D/A converters for this particular condition.

The previous example may be generalized by assigning a probability estimate to every bit in the received information signal plus noise, based on measurements made during each bit period. The analog value of a digital word, pursuant to the present invention, is computed as follows:

$$A_1 = \sum_{K=1}^{n} P_{k-1}(1) \, 2^{k-1} \quad 0 \le P_q(1) \le 1.0 \qquad (6)$$

where $P_q(1)$ is the probability that the qth digit is a binary one.

It is apparent that equation (6) minimizes the mean squared error in the presence of additive noise and therefore provides a better estimate of the analog sample than conventional D/A converters employing the process of equation (1).

The method of the present invention may be physically implemented by a variety of different hardware circuits as will be described herein.

BRIEF DESCRIPTION OF THE DRAWINGS

Various advantages of the present invention will become apparent to one skilled in the art upon reading the subject specification and by reference to the drawings in which.

DESCRIPTION OF THE PREFERRED EMBODIMENT

Figure 1:
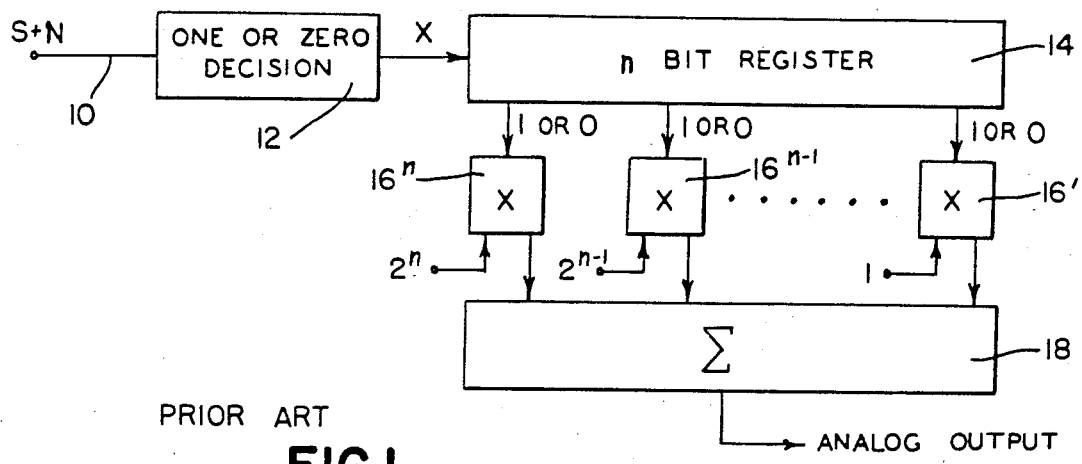
FIG. 1 is a block diagram of a D/A converter typically employed in the prior art.

A comparison of equations (1) and (6) shows that the primary difference between the converters of the prior art and the present invention is that the probability value P(1) derived for each bit is used in the analog reconstruction process instead of the hard decision value of zero or one forming $X_k$ of the prior art approach. Since the probability value will range from 0.0 to 1.0 for a given bit, the probability values can be thought of as being scaling factors to modify the weighting factors $2^{k-1}$ used in the normal conversion process. Pursuant to the present invention the probability values for each bit are readily calculated as a function of the amplitude of the bit signal and the signal to noise ratio. Both of these values can be readily calculated using a variety of electronic techniques.

Referring again to FIG. 2 it will be remembered that the observed bit voltage, a, can result from a binary one information signal added to a negative noise voltage, $e_{n1}$, or, alternatively, it can result from a binary zero added to a positive noise voltage, $e_{n2}$. Let P(1) be the probability that a given bit is a binary 1 and P(0) be the probability that it is a binary zero. Assuming Gaussian statistics $$\frac{P(1)}{P(0)} = \frac{R \frac{1}{\sqrt{2\pi}\,\sigma} \exp - \frac{(-e_{n1})^2}{2\sigma^2}}{\frac{1}{\sqrt{2\pi}\,\sigma} \exp - \frac{(e_{n2})^2}{2\sigma^2}} = \qquad (7)$$

$$R \exp - \frac{(e_{n1}^2 - e_{n2}^2)}{2\sigma^2}$$

where $\sigma$ is the root mean squared value of the noise and R is the ratio of ones to zeroes in the binary sequence.

In the usual situation R will be taken as unity. P(1) can be obtained from equation (7) by noting that, since $P(1) + P(0) = 1.0$:

$$P_{(1)} = \frac{P_{(1)}/P_{(0)}}{1 + P_{(1)}/P_{(0)}} \qquad (8)$$

let $e_{n1} = b\sigma$ \qquad (9)

then $e_{n2}=2-b\sigma$  (10)

where b is a constant.
Combining Equations (7), (8), (9), and (10):

$$P(1) = \exp\frac{2(1-b\sigma)}{\sigma^2} / \left[1 + \exp\frac{2(1-b\sigma)}{\sigma^2}\right] \quad (11)$$

Note that $a=1-e_{n1}=1-b\sigma$. Also, since the signal amplitude has been normalized to unity, $$\frac{1}{\sigma} = \sqrt{\frac{S}{N}}$$

Equation (11) may then be written as:

$$P(1) = \frac{\exp 2\left(\frac{S}{N}\right)a}{1 + \exp 2\left(\frac{S}{N}\right)a} = \frac{\exp 2\left(\frac{S}{N}\right)\sqrt{E_b}}{1 + \exp 2\left(\frac{S}{N}\right)\sqrt{E_b}} \quad (12)$$

where $E_b=a^2$ is the normalized energy determined for each bit.

Figure 3:
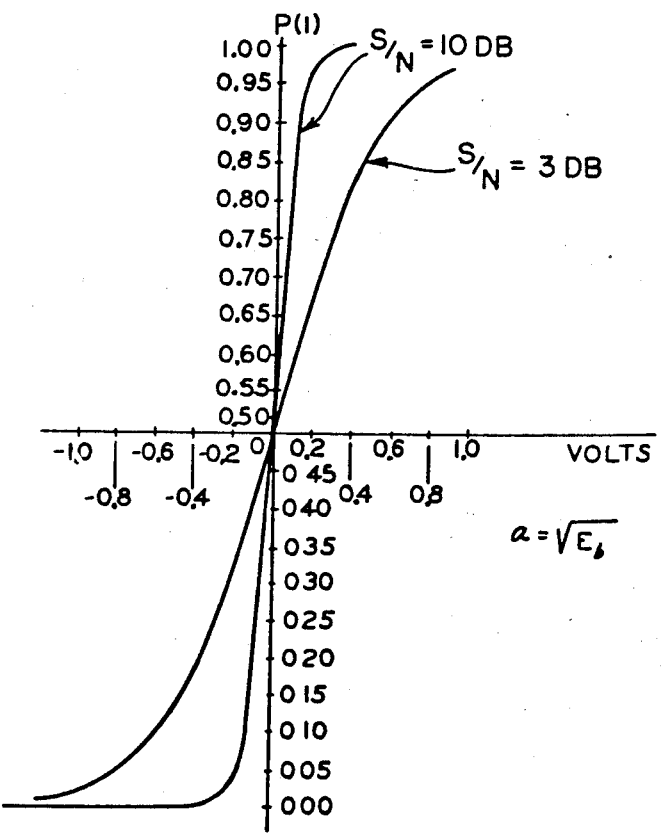
FIG. 3 is a graph illustrating probability values as a function of a bit voltage level for various system signal to noise ratios.

An inspection of equation (12) shows that the only variables for determining the probability value is the amplitude of the signal, a, for each bit and the signal to noise ratio. Equation (12) has been plotted in FIG. 3 for S/N=10 dB and for S/N=3 dB. A study of FIG. 3 will show that in the more electrically noisy environment, for any given positive voltage level, a, the probability that it is a binary one is less than in the less noisy environment, and where the voltage, a, is negative the probability that it is a binary one is more than in the less noisy environment. This is especially true for certain signal amplitudes. For example, where a=0.2 volts the probability that it is a binary one is only about 0.65 where the signal to noise ratio is 3 dB whereas it is about 0.95 when the signal to noise ratio is 10 dB.

Figure 4:
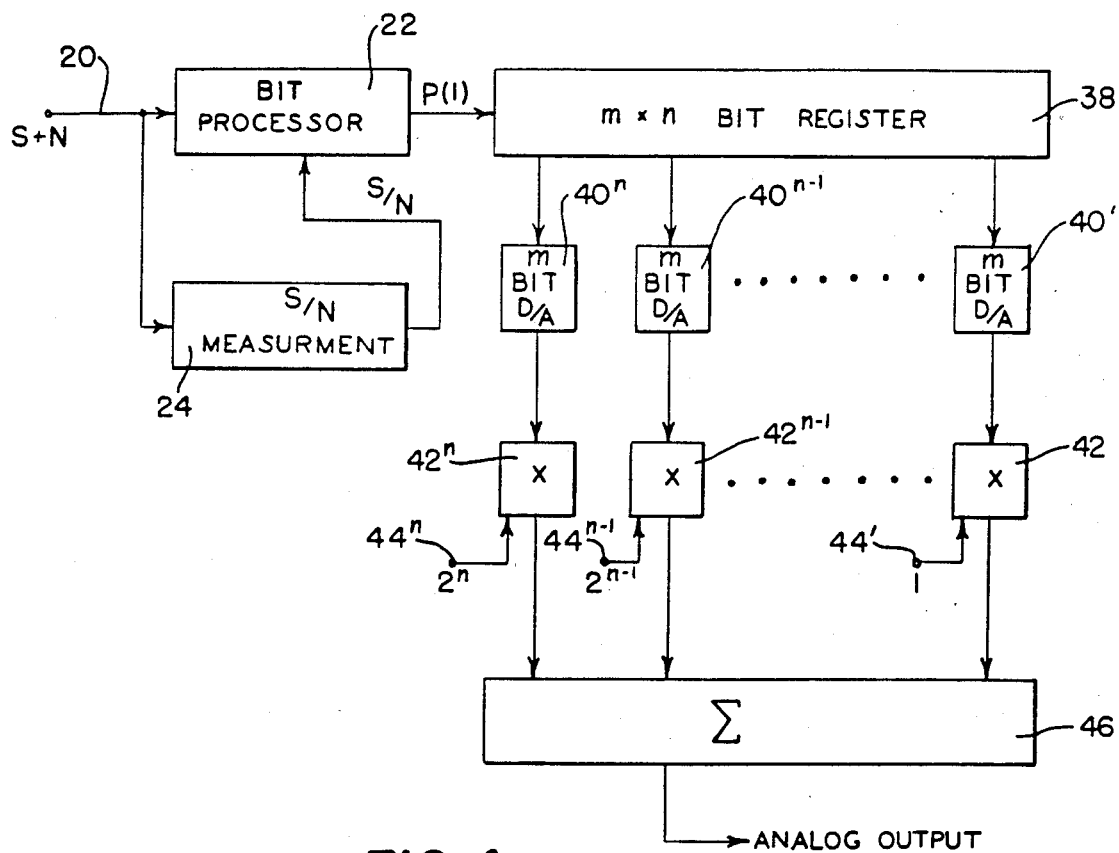
FIG. 4 is a block diagram of one embodiment of circuitry for employing the teachings of the present invention.

FIG. 4 illustrates one embodiment of the circuitry for carrying out the teachings of the present invention. The incoming data (S+N) is coupled over input line 20 to the inputs of bit processor 22 and signal to noise ratio measurement circuitry 24.

Figure 5:
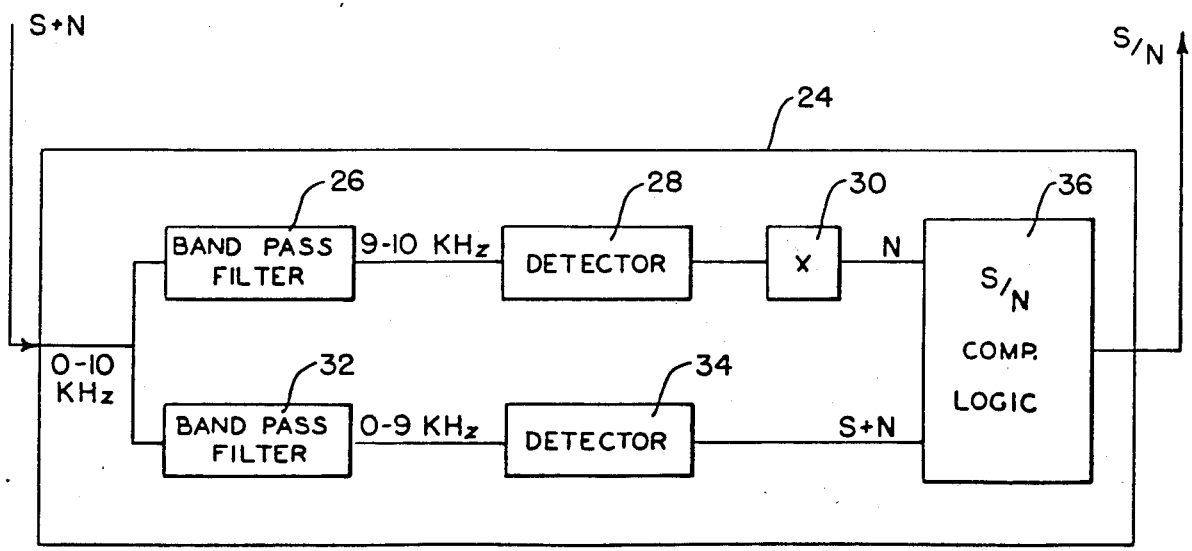
FIG. 5 is a block diagram of one embodiment of a signal to noise ratio measurement circuit.

The purpose of circuitry 24 is to measure the signal to noise ratio for the incoming data and can be accomplished in a variety of ways. FIG. 5 illustrates one possible implementation. Assume that the incoming data is transmitted over a band width of zero to ten kilohertz. The noise is measured by isolating the edges of the band where little information content is expected to be found. For example, a band pass filter 26 may be used to isolate the upper most frequency segment such as in the range of 9-10 kilohertz. The energy in that band segment is measured by detector 28. Detector 28 may take the form of a square law detector. Since the output of detector 28 is the noise associated with only 1/9 of the remaining data band, it is multiplied by 9 by multiplier 30 to provide a noise value N corresponding to the noise associated over the entire data band. The remaining portions of the data band more likely to contain signal content are passed by filter 32 where the energy thereof is measured by detector 34 providing a measurement of the signal plus noise (S+N). Signal to noise computational logic is adapted to compute the signal to noise ratio S/N from the derived values of the noise (N) and signal plus noise $_e$(S+N). This computation is straight forward because of the relationship:

$$\frac{S}{N} = \frac{S+N}{N} - 1 \quad (13)$$

The output of circuitry 24 is connected to an input of bit processor 22. The functions of processor 22 are twofold. It measures and stores an electrical characteristic of the incoming data for each bit period. In this embodiment processor 22 simply measures the relative voltage amplitude, a, in each bit period. However, more sophisticated approaches can be employed. For example, processor 22 may integrate the voltage received over an entire bit period and store the value of the integral. In any case, a value for a and thus $E_b$ is provided.

The second function of the processor 22 is to solve equation (12) or some similar equation depending upon the mode of processing and the statistics of the noise (gaussian, etc.) for each bit in a received binary system. Thus, the output of processor 22 will be successive probability values for each bit period in the received data stream. Each probability value is represented by an m bit binary number. Again, bit processor 22 may be implemented in a variety of different ways. In this embodiment processor 22 is a conventional microprocessor programmed to solve equation (12) after the derived values of a and S/N have been converted into digital numbers. It will be remembered that equation (12) contains only two variables, a or $E_b$ and S/N and therefore the calculation is quite straight forward and can be implemented alternatively in a custom integrated circuit chip.

The probability values for each bit are shifted into an m×n bit register 38. After the probability values for each bit in the word have been generated, register 38 simultaneously shifts out all the probability values together in parallel. Each of the m bit probability values are converted to corresponding analog quantities by conventional D/A converters 40. Analog multipliers 42 are operative to multiply the probability values for each bit by their respective weighting factors supplied over lines 44. The outputs of analog multipliers 42 are summed together by summation device 46 to generate the resultant analog signal.

Figure 2:
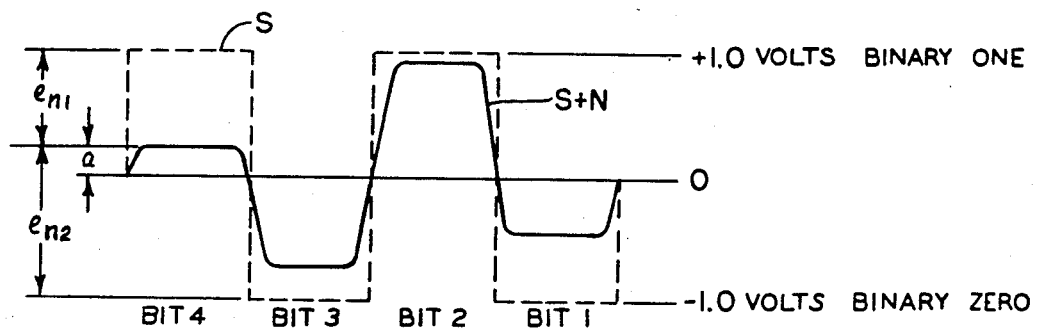
FIG. 2 is a simplified waveform diagram of a digital data word.

If the incoming binary stream (S+N) is of the nature as shown in FIG. 2 the probability values that are generated by bit processor 22 will vary accordingly. For example, the probability that bit 2 is a binary one is very great and thus will provide a scaling factor to its respective analog multiplier of close to 1.0. On the other hand, the scaling factors provided for bits 1 and 3 are very low, with the scaling factor for bit 4 being somewhat greater than 0.5.

It should be emphasized that the embodiment of FIG. 4 is merely one embodiment of the subject invention illustrative of the principles employed. In fact, it may be preferable to have bit processor 22 utilize analog techniques. In such a case, bit processor 22 would utilize the analog values of a and S/N to generate corresponding analog probability values for each bit period. These analog probability values would be stored in n sample and hold circuits which then would be applied directly as inputs to the analog multipliers 42. This would eliminate the need for register 38 and all of the D/A converters 40.

Figure 6:
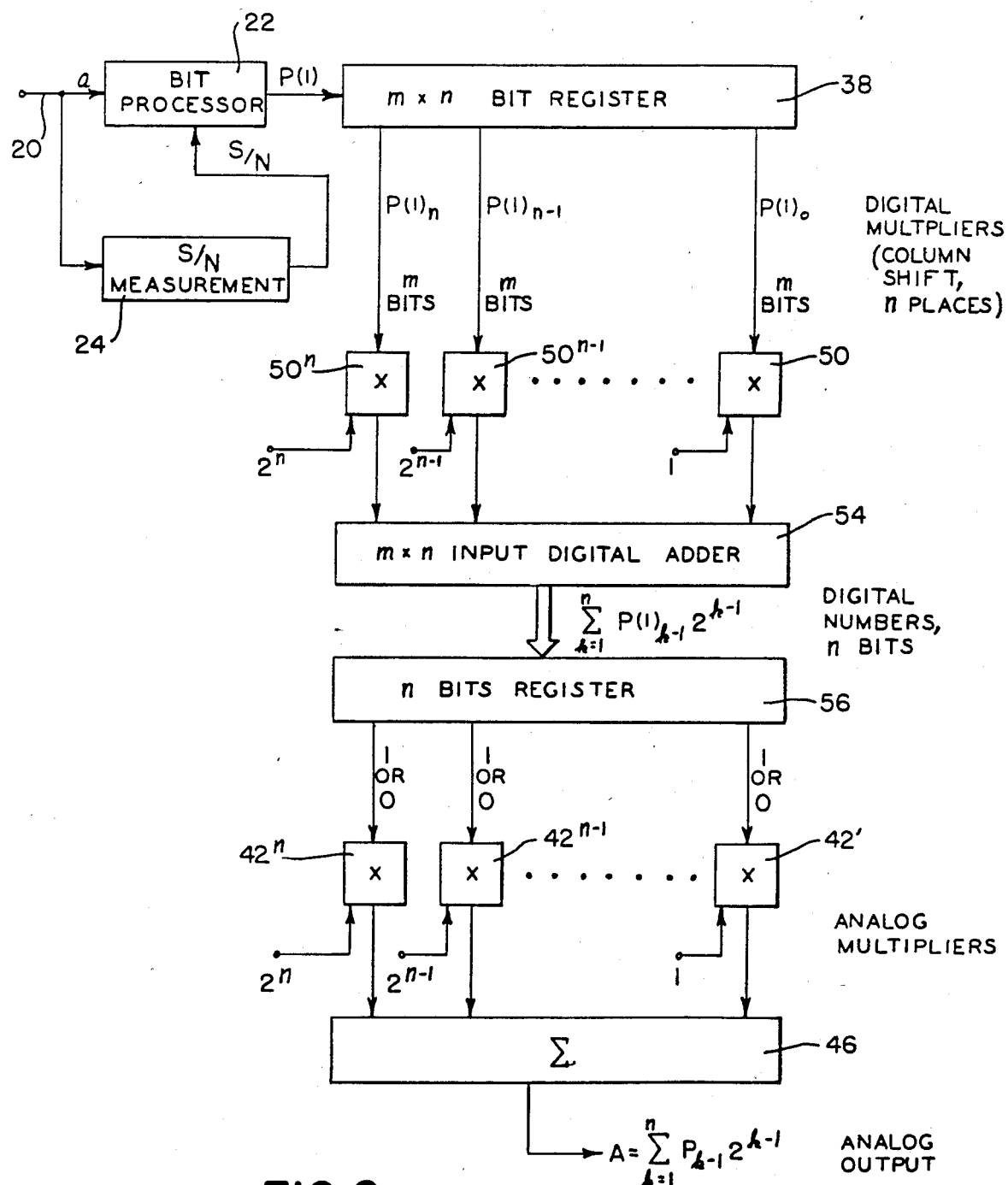
FIG. 6 is a block diagram of another embodiment of the present invention.

Another alternative embodiment is shown in FIG. 6. To a large extent it is similar to the embodiment of FIG. 4 and thus the same reference numerals will be used for common components. In this embodiment much of the multiplication and summation is made in the digital domain for the purposes of eliminating the plurality of D/A converters 40 of the embodiment of FIG. 4. Digital multipliers 50 are operative to multiply the digital representation m of each of the probability values, with digital representations of the relative weights for each bit position being applied over lines 52. The outputs of digital multipliers 50 would thus be a series of digital words having values corresponding to the weights for each bit position as scaled by their respective probability values. These digital numbers would be added together in a digital adder 54 to generate an n bit digital number. The output of adder 54 would be the digital equivalent of equation (6), the value of the digital number being the result of the aforementioned probability value scaling process. The output of adder 54 is coupled to the input of register 56. Each bit position in register 56 will now be a one or a zero. Thus, the output of register 56 can be connected to conventional analog conversion circuitry providing an analog signal corresponding to the digital number value in register 56.

It would also be feasible to implement the embodiment of FIG. 6 with an all microprocessor version eliminating the parallel hardware. The microprocessor would perform the required functions in a bit by bit fashion in an iterated program loop. The microprocessor would be operative to transfer the results of each iteration to an accumulator until the contents of an entire input word has been processed. It should also be mentioned that although the principles of this invention have been illustrated by reference to a binary stream, they are applicable to digital to analog converters operating with any number base.

It should also be mentioned that the principles of this invention are not restricted to digital codes that are associated with number bases. For example, these principles are applicable to a common for of encoding employed with speech signals, known as continuously variable slope delta modulation (CVSD). Therefore, while this invention has been described in connection with particular examples thereof, no limitation is intended thereby except as defined in the appended claims.

I claim:

1. In a method of converting a multibit digital data word into a corresponding analog signal, the method including the steps of multiplying weighting factors for each bit position with a value associated with each bit in a series of analog multipliers, and wherein the outputs of said analog multipliers are summed together to form the resultant analog signal, the improvement comprising:

generating a probability value for each bit corresponding to the probability that the bit is a logical one as a function of measurements of voltage characteristics of each bit and noise associated with the word to be converted; and using said probability values as scaling factors to modify the outputs of said analog multipliers to thereby reduce potential for error.

* * * * *